United States Patent
Chiou et al.

(10) Patent No.: US 9,846,095 B2
(45) Date of Patent: Dec. 19, 2017

(54) 3D STACKED PIEZORESISTIVE PRESSURE SENSOR

(71) Applicant: Continental Automotive Systems, Inc., Auburn Hills, MI (US)

(72) Inventors: Jen-Huang Albert Chiou, Libertyville, IL (US); Robert C Kosberg, Grayslake, IL (US); Shiuh-Hui Steven Chen, Lake Zurich, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 121 days.

(21) Appl. No.: 15/082,336

(22) Filed: Mar. 28, 2016

(65) Prior Publication Data
US 2016/0320255 A1 Nov. 3, 2016

Related U.S. Application Data

(60) Provisional application No. 62/145,174, filed on Apr. 9, 2015.

(51) Int. Cl.
*G01L 7/08* (2006.01)
*G01L 9/00* (2006.01)
(Continued)

(52) U.S. Cl.
CPC .............. *G01L 9/0052* (2013.01); *B81B 7/00* (2013.01); *G01L 9/0042* (2013.01);
(Continued)

(58) Field of Classification Search
CPC ..... G01L 7/00; G01L 7/08; G01L 9/00; G01L 9/0042; G01L 9/0055; G01L 9/06;
(Continued)

(56) References Cited

U.S. PATENT DOCUMENTS 5,600,071 A * 2/1997 Sooriakumar ........ G01L 9/0055
73/721
7,061,099 B2 6/2006 Lu et al.
(Continued)

FOREIGN PATENT DOCUMENTS

DE 102006022379 A1 * 11/2007 .......... G01L 9/0073
JP 09126927 A * 5/1997 .......... G01L 9/0055
(Continued)

OTHER PUBLICATIONS

Search Report dated Dec. 18, 2015, from corresponding GB Patent Application No. GB1507262.2.

*Primary Examiner* — Nguyen Ha

(57) ABSTRACT

In a microelectromechanical system (MEMS) pressure sensor, thin and fragile bond wires that are used in the prior art to connect a MEMS pressure sensing element to an application specific integrated circuit (ASIC) for the input and output signals between these two chips are replaced by stacking the ASIC on the MEMS pressure sensing element and connecting each other using conductive vias formed in the ASIC. Gel used to protect the bond wires, ASIC and MEMS pressure sensing element can be eliminated if bond wires are no longer used. Stacking the ASIC on the MEMS pressure sensing element and connecting them using conductive vias enables a reduction in the size and cost of a housing in which the devices are placed and protected.

28 Claims, 15 Drawing Sheets

(51) Int. Cl.
  *G01L 9/06* (2006.01)
  *G01L 19/00* (2006.01)
  *G01L 19/14* (2006.01)
  *B81B 7/00* (2006.01)

(52) U.S. Cl.
  CPC .............. *G01L 9/0055* (2013.01); *G01L 9/06* (2013.01); *G01L 19/0076* (2013.01); *G01L 19/0084* (2013.01)

(58) Field of Classification Search
  CPC . G01L 19/00; G01L 19/0076; G01L 19/0084; G01L 19/14; B81B 7/00
  See application file for complete search history.

(56) References Cited

U.S. PATENT DOCUMENTS

| | | | | |
|---|---|---|---|---|
| 8,171,800 B1* | 5/2012 | Chiou | ............... | G01L 9/0052 73/716 |
| 8,215,176 B2 | 7/2012 | Ding et al. | | |
| 8,466,523 B2* | 6/2013 | Chiou | ............... | G01L 9/0052 257/417 |
| 8,816,453 B2* | 8/2014 | Zoellin | ............... | H04R 19/04 257/416 |
| 2009/0282917 A1 | 11/2009 | Acar | | |
| 2010/0019393 A1 | 1/2010 | Hsieh et al. | | |
| 2011/0227173 A1 | 9/2011 | Seppala et al. | | |
| 2012/0266684 A1* | 10/2012 | Hooper | ............... | G01L 9/0052 73/721 |
| 2014/0202255 A1* | 7/2014 | Niemann | ............... | G01L 9/08 73/753 |
| 2015/0108653 A1* | 4/2015 | Hooper | ............... | B81B 7/007 257/774 |
| 2015/0168242 A1* | 6/2015 | Matsuzawa | ............... | H01L 27/07 257/419 |
| 2016/0091384 A1* | 3/2016 | Muller | ............... | G01L 19/141 73/715 |

FOREIGN PATENT DOCUMENTS

| | | | | |
|---|---|---|---|---|
| WO | WO 2009027897 A2 * | 3/2009 | ............ | G01L 9/0042 |
| WO | 2014/020387 A1 | 2/2014 | | |
| WO | 2014/020388 A1 | 2/2014 | | |

* cited by examiner

US 9,846,095 B2

3D STACKED PIEZORESISTIVE PRESSURE SENSOR

BACKGROUND

FIG. 1 is a cross-sectional view of a prior art MEMS piezoresistive pressure sensor module 100. It provides excellent pressure measurements for a wide range of fluids across a wide range of low pressures.

The pressure sensor module comprises essentially two dies, one is a MEMS pressure sensing element 104 and the other is an application specific integrated circuit (ASIC) identified by reference numeral 106. A vacuum cavity 103 is formed between a diaphragm 105 and a substrate 107 in the pressure sensing element 104. When pressure is applied on the diaphragm 105, the diaphragm 105 deflects and creates stresses on a Wheatstone bridge (not shown) on the diaphragm and converts the diaphragm deflection into a measurable voltage change. The two dies 104 and 106 are mounted to a housing substrate 112 using an adhesive 114. Small-diameter bond wires 102 extend and connect between the MEMS pressure sensing element 104 and the ASIC 106. The bond wires 102 also extend and connect between the ASIC 106 and a lead frame 110.

The wires 102 add cost and are of course susceptible to failure. Eliminating wires that extend between the MEMS pressure sensing element 104 and the ASIC 106 and between the ASIC 106 and the lead frame 110 would reduce cost and improve the reliability of the MEMS pressure sensing element and MEMS pressure sensors.

A viscous gel 116 inside a pocket 101 protects the pressure sensing element 104, the ASIC 106, and the bond wires 102 from pressurized media, the pressure of which is to be measured. The gel 116 needs to be soft enough in order to transmit pressure. The gel 116 on the top of the diaphragm 105, however, can cause a power-on voltage shift of the signals output from the device if high charges are stored in the gel. The gel 116 can also affect sensing accuracy in a severe vibration environment because of its mass. The gel 116 is expensive especially in a large pocket with two separated dies or chips 104 and 106. Reducing the pocket size, eliminating the gel and bond wires, or at least reducing gel quantity, or replacing expensive gel by less expensive gel for lower cost and better performance, would be an improvement over the prior art.

SUMMARY OF THE INVENTION

The protective gel and bond wires can be eliminated and the size of a pocket holding a pressure sensor device can be significantly reduced by stacking an application specific integrated circuit (ASIC) with a cavity on top of a MEMS pressure sensing element. The ASIC and pressure sensing element are electrically connected to each other using conductive vias formed into the ASIC.

DETAILED DESCRIPTION

The I.E.E.E. Standards Dictionary, Copyright 2009 by the IEEE, defines "via" as a physical connection between two different levels of interconnect, or between a level of interconnect and a physical or logical pin. As used herein, a via is a vertical or substantially vertical column of conductive material formed into a substrate having opposing top and bottom or first and second sides. A via can extend all the way through a substrate, i.e., between and through opposing top and bottom/first and second sides but as shown in the accompany figures it can also extend only part way through a substrate. A via provides a vertically-oriented conductive pathway through or part way through a semiconductor substrate.

As used herein, the term "bond pad" refers to the conductive areas commonly found on an ASIC or a MEMS pressure sensing element of the prior art. The term should not, however, be construed as limited to conductive areas used in the prior art but should instead be more broadly construed to include any size conductive area on a surface of either an ASIC or a MEMS pressure sensing element, to which an electrical connection can be made.

Thin bond wires, which in prior art pressure sensor devices extend between bond pads on an ASIC and bond pads on a MEMS pressure sensing element are eliminated by vertically stacking the ASIC on top of a MEMS pressure sensing element. The two devices are connected electrically using vias formed into the ASIC and located to align with bond pads on the MEMS pressure sensing element. The vias are positioned or located in ASIC substrate so that when the ASIC is placed on a MEMS pressure sensing element, the vias align with bond pads on the MEMS pressure sensing element to which prior art bond wires would be attached.

Figure 1:
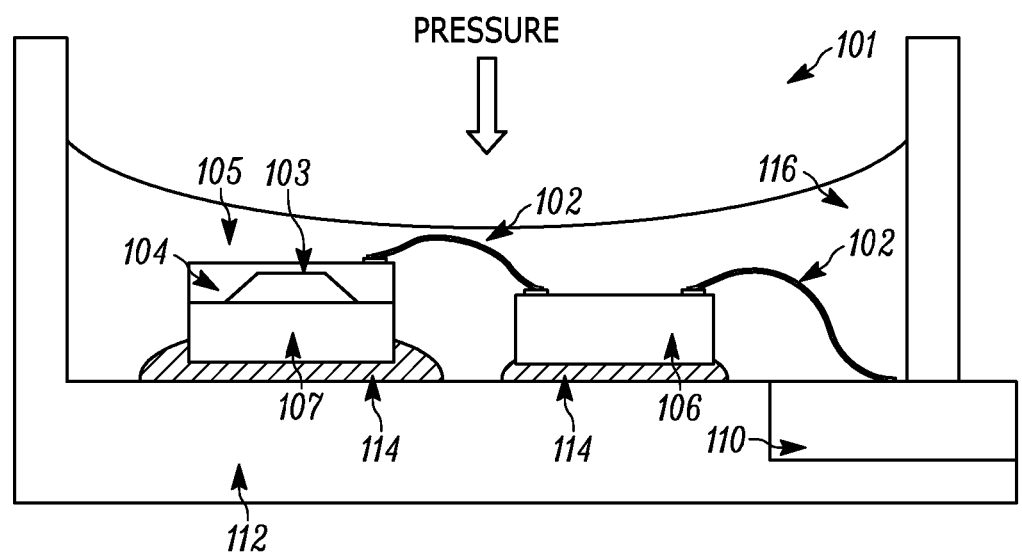
FIG. 1 depicts a prior art topside absolute pressure sensing element inside a pocket, which is connected to an application specific integrated circuit (ASIC) by bond wires.
Figure 2A:
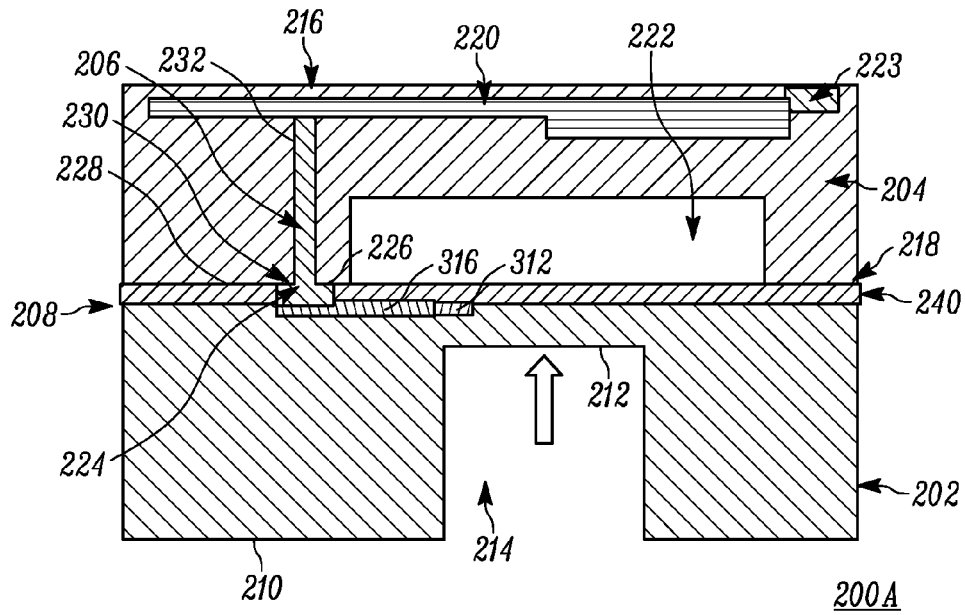
FIG. 2A is a cross-sectional view of a first embodiment of a backside pressure sensor device comprising a MEMS pressure sensing element and an ASIC, which are coupled to each other with conductive vias that extend through the backside of the ASIC.

FIG. 2A is a cross-sectional view of a first embodiment of a backside absolute pressure sensor device 200 comprising a microelectromechanical system (MEMS) pressure sensing element 202 on top of which is an application specific integrated circuit (ASIC) 204. The MEMS pressure sensing element 202 is similar to the MEMS pressure sensing element described in U.S. Pat. No. 8,215,176 and U.S. Pat. No. 8,466,523. Both prior art patents also disclose an ASIC, which both patents describe as being connected to a MEMS pressure sensing element using bond wires. Both patents are incorporated herein by reference in their entirety.

The MEMS pressure sensing element 202 has a top side 208 and an opposing bottom side 210. The top side 208 includes a flexible diaphragm 212. The diaphragm 212 deflects upwardly and downwardly responsive to pressure and/or vacuum applied to the diaphragm 212 through a pressure port 214 formed into the bottom 210 of the element 202.

Figure 4:
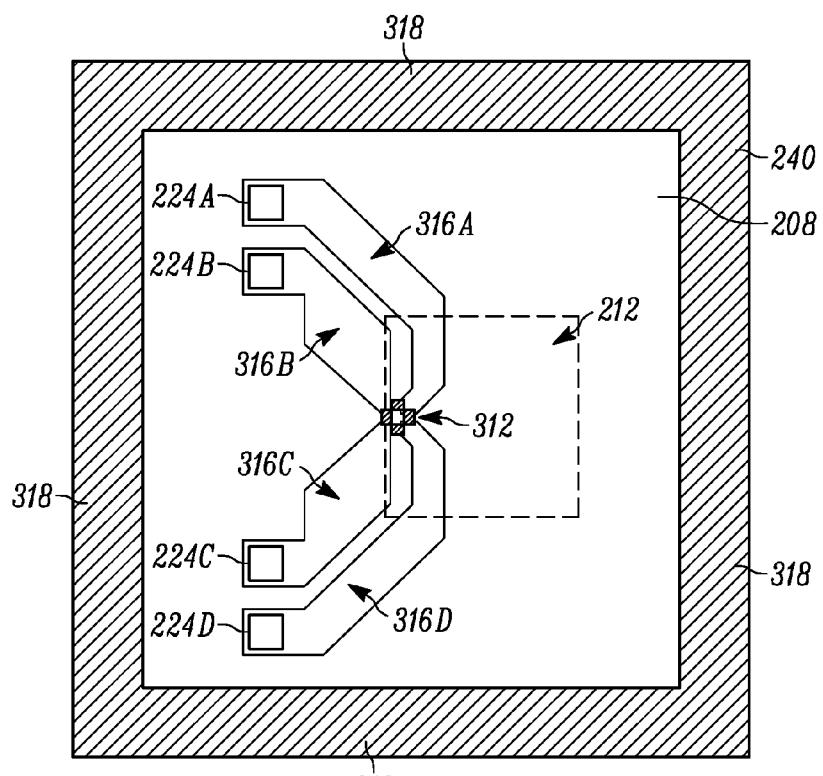
FIG. 4 depicts the first or top side of the MEMS pressure sensing element and metal bond pads or terminals, which are aligned with and mate with the vias in FIG. 3.

As shown in FIG. 4, a Wheatstone bridge circuit is formed on the topside 208 of the MEMS pressure sensing element 202 by four P-doped piezoresistors 312 near an edge 314 of the diaphragm 212 and four interconnects 316A-316D. The four piezoresistors 312 are electrically connected to the metal bond pads 224A-224D by the four interconnects 316A-316D, which are P+ doped localized regions of the top side 208. The Wheatstone bridge circuit shown in FIG. 4, is called a picture-frame Wheatstone bridge (PFWB) or a localized Wheatstone bridge (LWB).

Figure 9:
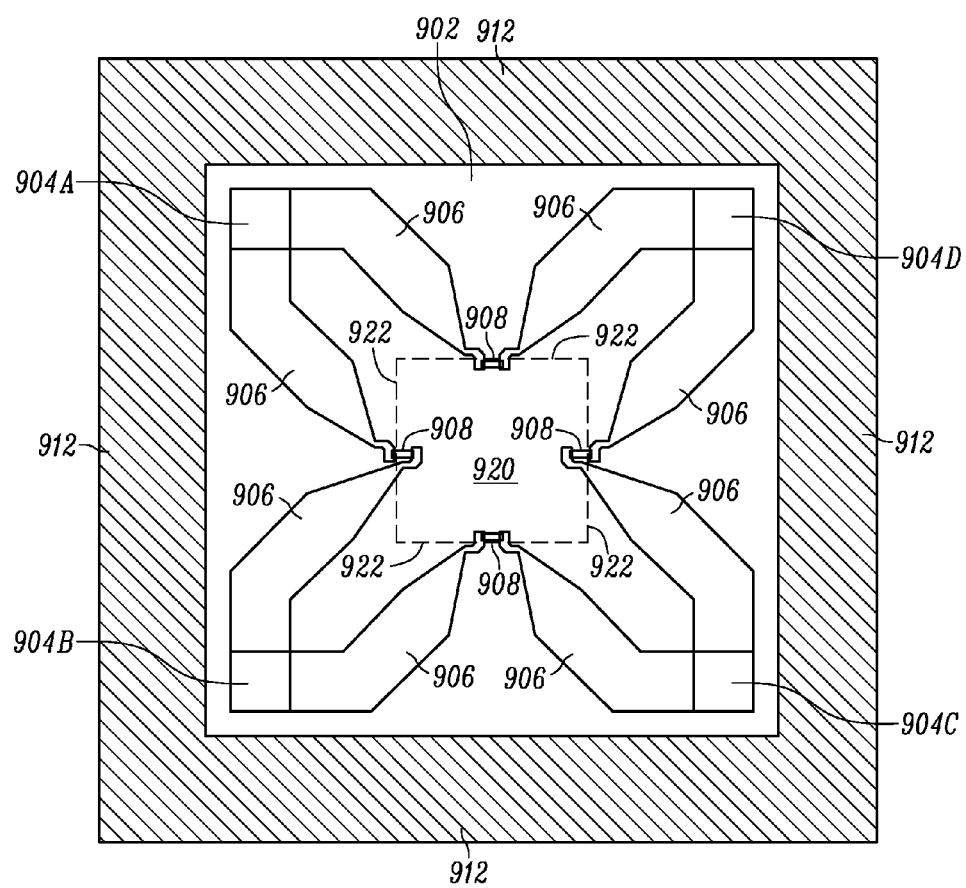
FIG. 9 depicts the first or top side of a MEMS pressure sensing element with metal bond pads that mate with the vias shown in FIG. 8A and depicting a bonding area either by fusion or glass frit bond around the perimeter of the first or top side.

A different type of Wheatstone bridge circuit is depicted in FIG. 9 with each piezoresistor 908 doped and located near each associated diaphragm edge 922 on the top side of a diaphragm 920. This type of Wheatstone bridge circuit is called a distributed Wheatstone bridge (DWB).

As with the MEMS pressure sensing element, the ASIC 204 has a top side 216 and an opposing bottom side 218. Passive and active electronic devices that comprise a circuit 220 are formed into the top side 216 by conventional integrated processing techniques well known to those of ordinary skill in the integrated circuit art.

Unlike the ASICs used in prior art, the ASIC 204 shown in FIG. 2A has a bottom or second side 218, which is formed to have a recess 222, which is a hollowed-out space formed into the bottom or second side 218. When the ASIC 204 having a recess 222 is attached to a MEMS pressure sensing element 202 in a vacuum or near vacuum, the recess 222 becomes or defines an evacuated cavity 222 that is directly above the diaphragm 212. Being evacuated, the cavity 222 does not exert force on the diaphragm 212 facilitating its deflection responsive to pressure of a fluid in a pressure cavity 214.

As shown in FIG. 2A, the metal bond pads 224 of the MEMS pressure sensing element 202 are located directly below conductive vias 206 that extend from the bottom side 218 of the ASIC 204 to electronic circuitry formed in the top side 216 of the ASIC. An electrical connection between the bond pads 224 on the top surface 208 of the MEMS pressure sensing element 202 and the bottom end 228 of a conductive via 206 is assured by an intermetallic bond pad 230 that is attached to the bottom end 228 of a conductive via 206 on the bottom or second side of the ASIC 204. The top end 232 of the conductive via 206 is connected to the electrical circuitry 220 by conventional circuit traces formed in the circuitry 220 itself. The vias 206 thus provide a solid electrical pathway between the Wheatstone bridge circuit of the MEMS pressure sensing element 202 and electrical circuitry 220 formed into the top or first side 216 of the ASIC 204.

The MEMS pressure sensing element 202 is attached to the ASIC 204 by a bonding layer of silicon dioxide 240. Input and output signals of the ASIC 204 are available at metal bond pads 223 located on the top side 216 of the ASIC 204.

Figure 2B:
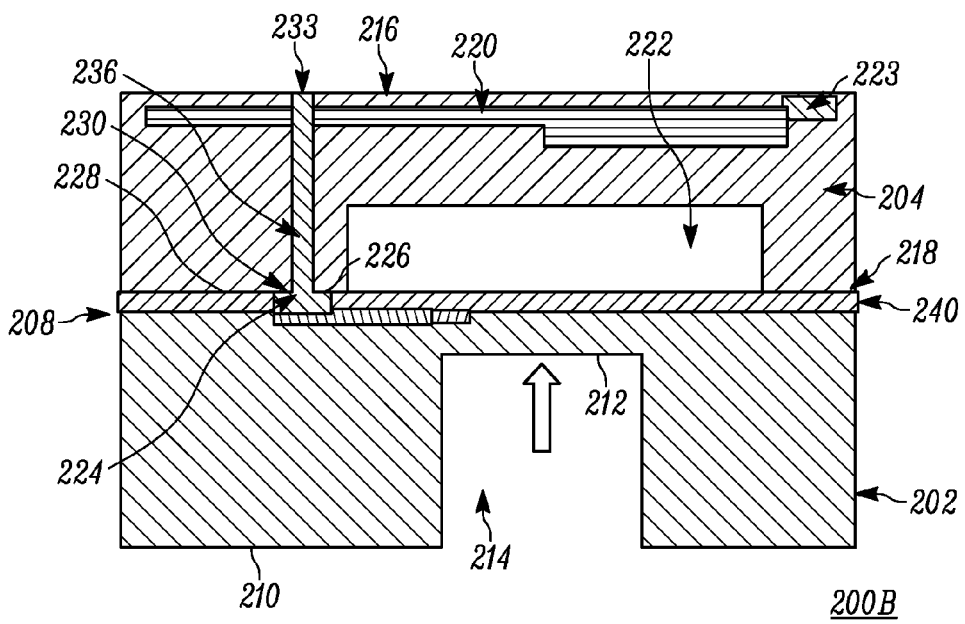
FIG. 2B is a cross-sectional view of a second embodiment of a backside pressure sensor device comprising a MEMS pressure sensing element and an ASIC, which are coupled to each other with conductive vias that extend completely through the backside of ASIC with circuitry formed in the topside of the ASIC.

FIG. 2B is a cross-sectional view of a second embodiment of a backside absolute pressure sensor device 200 comprising a MEMS pressure sensing element 202 on top of which is an application specific integrated circuit (ASIC) 204. The embodiment of FIG. 2B differs from the one shown in FIG. 2A by conductive vias 206B that extend completely through the topside 216 of the ASIC 204.

As FIG. 2B shows, the top end 233 of the via 236 is exposed for an electrical connection. Such a via 236 can connect to circuitry 220 formed in the top side of the ASIC 204 and continue to extend upwardly from the circuitry 220 to the top side 216 of the ASIC 204.

Figure 3:
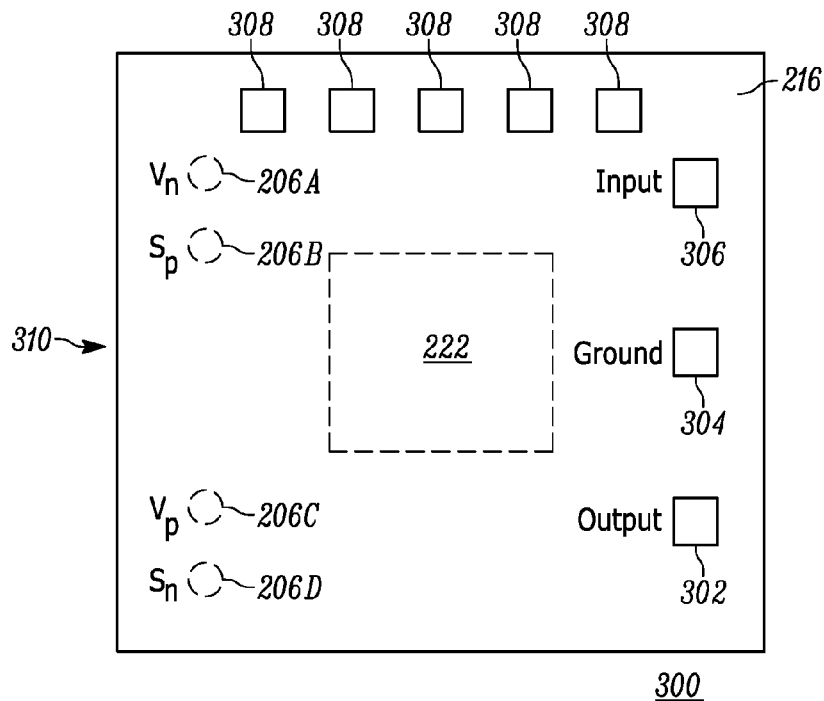
FIG. 3 depicts a first or top side of the ASIC depicted in FIGS. 2A and 2B and shows in broken lines, the relative locations of conductive vias that extend through the backside of ASIC and metal bond pads on the topside.

FIG. 3 is a plan view of the first or top side 216 of the ASIC 204 shown in FIG. 2A. FIG. 3 thus shows in phantom lines four conductive vias 206A-206D, each of which extend part way up the ASIC 204 from its backside 218, not visible in FIG. 3, toward the topside 216 of the ASIC 204. The vias 206A-206D are located or positioned in the ASIC to be directly above where metal bond pads 224A-224D are located on the top surface of a MEMS pressure sensing element 202 as shown in FIG. 4 so that the vias 206A-206D align with the bond pads 224 when the ASIC 204 is placed on top of the MEMS pressure sensing element 202.

Figure 8A:
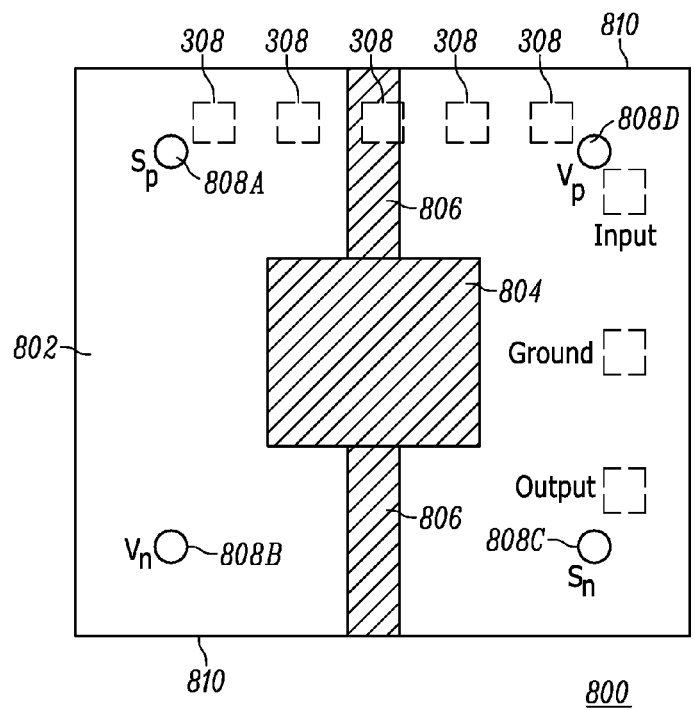
FIG. 8A is a plan view of the second or bottom side of an ASIC and that depicts a recess and trenches on the second or bottom side of the ASIC, exposed ends of conductive vias that mate with corresponding bond pads on a MEMS pressure sensing element.
Figure 8B:
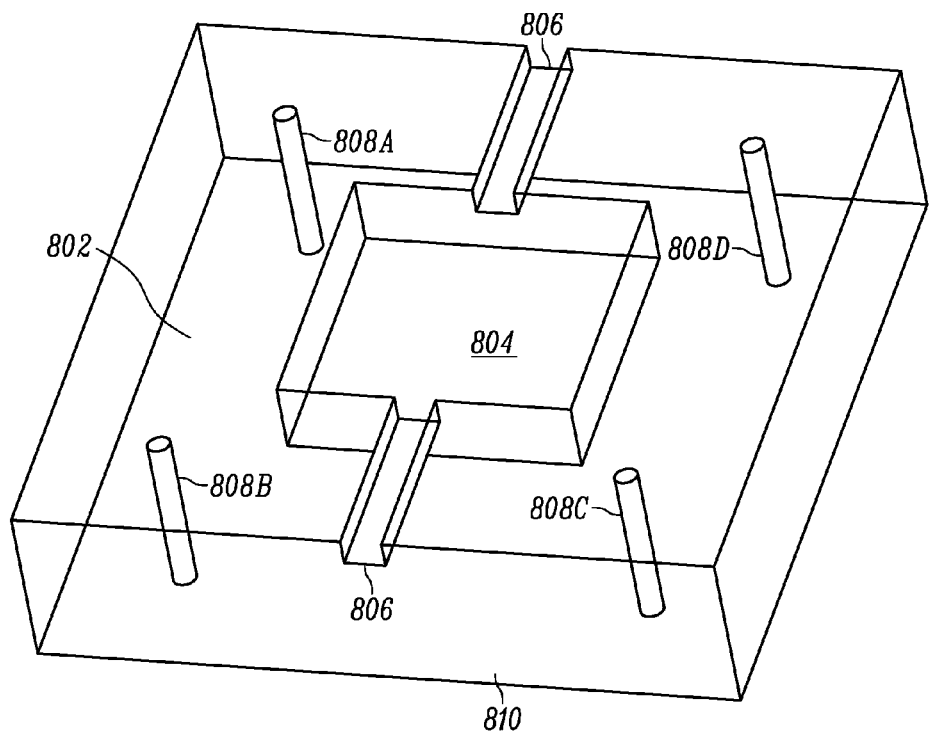
FIG. 8B is a perspective view of the second or bottom side of ASIC depicted in FIG. 8A.

As shown in FIG. 3, the vias 206A-206D are located along one side 310 of the ASIC 204 but can also be symmetrically distributed around the recess 222 formed into the opposing bottom side 218 of the ASIC 204, as shown in FIGS. 8A and 8B. The location of the recess 222 is depicted in FIG. 3A as a square drawn in broken or phantom lines. Symmetric distribution of the vias around the recess 222 reduces stress concentrations in the ASIC 204.

The top side 216 of the ASIC 204 is provided with several metal bond pads 302, 304, 306 and 308. Three of the bond pads 302, 304 and 306 are denominated as output, ground and input respectively. Five other bond pads 308 are for testing the ASIC 204.

FIG. 4 depicts the first or top side 208 of the MEMS pressure sensing element 202. FIG. 4 also depicts the location of four metal bond pads 224A-224D on the top side 208 of the MEMS pressure sensing element 202.

A Wheatstone bridge circuit is formed by four P− doped piezoresistors 312 near an edge 314 of the diaphragm 212 and four interconnects 316A-316D. The four piezoresistors 312 are electrically connected to the metal bond pads 224A-224D by the four interconnects 316A-316D, which are P+ doped localized regions of the top side 208.

In the first embodiment of the pressure sensor device 200, the top side 208 of the MEMS pressure sensing element 202 is attached to the bottom side 218 of the ASIC 204 by a fusion bond. In one embodiment, except for the metal bond pads, the entire top side 208 of the MEMS pressure sensing element 204 is covered with a silicon dioxide layer, which is used to form a silicon fusion bond. In FIG. 4, a fusion bonding area 318 is provided with a thin layer of silicon dioxide, which when heated provides a silicon fusion bond between the MEMS pressure sensing element 202 and the ASIC 204. The silicon dioxide 240 in the fusion bonding area 318 can form a silicon fusion bond. In yet another embodiment, also shown by FIG. 4, the silicon dioxide 240 in the fusion bonding area 318 is additional silicon dioxide placed on top of a layer of silicon dioxide that extends over the entire top surface 208 of the MEMS pressure sensing element 204. In all three embodiments, an intermetallic bond 230 is formed and located between the conductive vias 206 and metal bond pads 224 as shown in FIG. 2A or an intermetallic bond 230 is formed and located between the conductive vias 236 and metal bond pads 224 as shown in FIG. 2B.

In yet other alternate embodiments, the silicon dioxide 240 can be replaced by, or substituted with a layer of glass frit, which when heated bonds the MEMS pressure sensing element 202 to the ASIC 204. In such embodiments, i.e., where the glass frit covers the top surface 208 or is localized into the fusion bonding area 318, a small droplet of solder referred to herein as a solder bump is used between the vias 206 and the metal bond pads 224. The layer of silicon dioxide 240 can also be placed onto the backside of the ASIC 204.

In yet another embodiment, the cavity/recess above the MEMS pressure sensing element is not evacuated but is instead provided with a fluid having a pressure that is to be sensed, or which is to affect the measurement of a fluid pressure applied to the diaphragm, as required by a differential pressure sensor. In order to apply a fluid pressure into the cavity, a pathway into the cavity must of course be provided.

Figure 10:
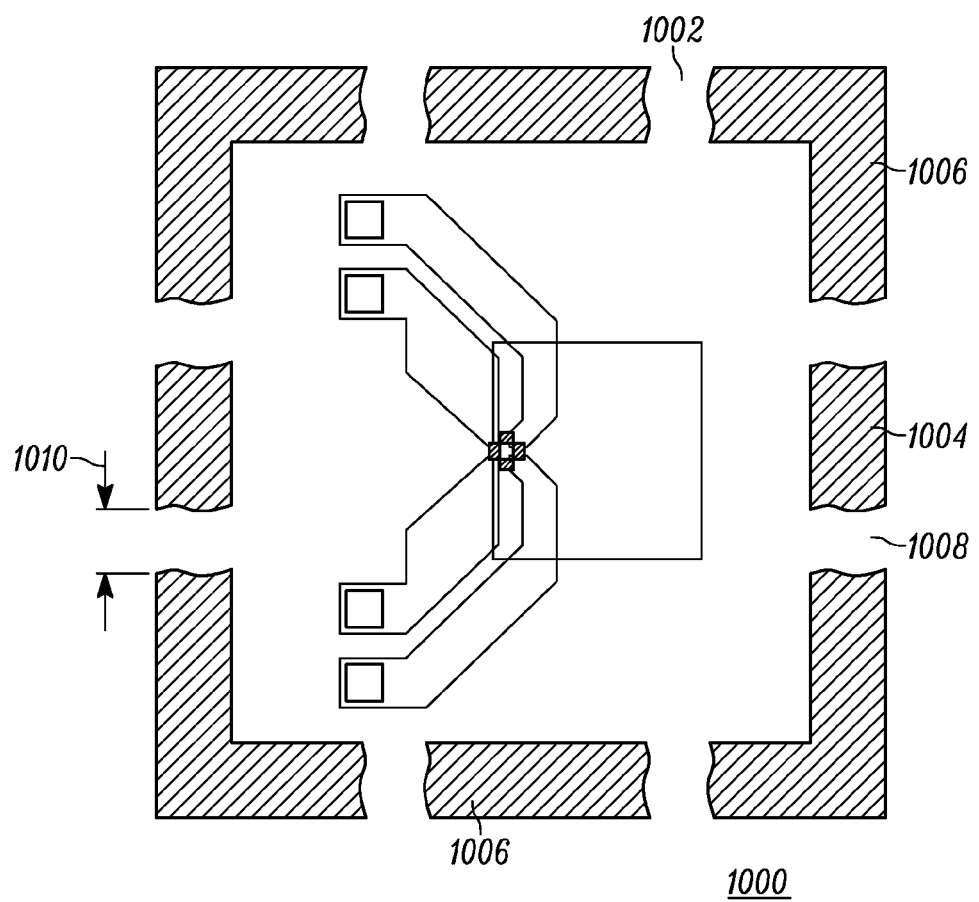
FIG. 10 depicts the first or top side of a MEMS pressure sensing element with metal bond pads that mate with the vias shown in FIG. 8A and a patterned layer of glass frit, the glass frit pattern providing openings through which a monitored fluid can pass.

In order to provide a fluid pathway into the cavity 222, the layer of either silicon dioxide or glass frit (or a mixture of them) between the ASIC 204 and the MEMS pressure sensing element 202 can be patterned, as shown in FIG. 10, which shows the top side 1002 of a MEMS pressure sensing element 1000 having a patterned bonding area 1004. Strips or regions 1006 of either silicon dioxide or glass frit or a mixture of them are separated from each other by spaces 1008 where no silicon dioxides or glass frit is applied to the top side 1002 of the MEMS pressure sensing element 1000. The open spaces 1008 have a predetermined width 1010 and a height, which extends out of the plane of FIG. 10 by a distance substantially equal to the thickness of the silicon dioxide or glass frit. For air, the thickness of the bonding layer is preferably at least 20 microns up to about 200 microns. The open spaces 1008 are thus sized, shaped and arranged to allow a particular fluid to pass through them and into the recess 222 formed into the second side of the ASIC 204.

Figure 5:
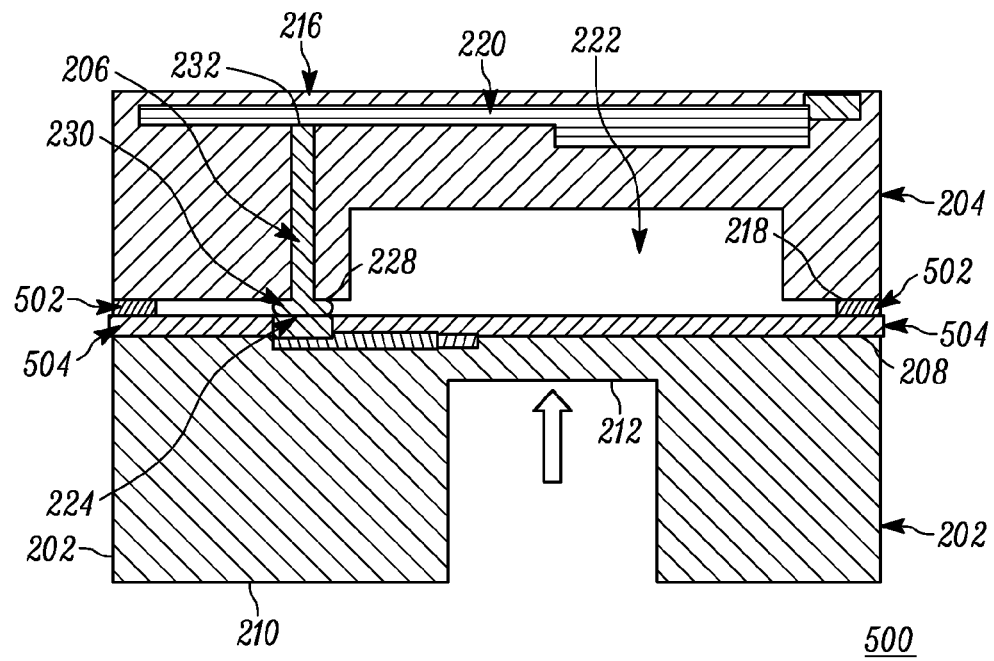
FIG. 5 is a cross-sectional view of a third embodiment of a pressure sensor device comprising a MEMS pressure sensing element and an ASIC, which are coupled to each other by glass frit and solder bumps with conductive vias that extend through the backside of the ASIC.

FIG. 5 is a cross-sectional view of a third embodiment of a backside absolute pressure sensor device 500 comprising the MEMS pressure sensing element 202 and the ASIC 204 having conductive vias 206 that extend up from the bottom side 218 of the ASIC 204 part way through the ASIC 204. The embodiment of FIG. 5 differs from the embodiment shown in FIG. 2-4 by how the ASIC 204 and sensing element 202 are attached to each other.

In the embodiment shown in FIG. 5, the MEMS pressure sensing element 202 and the ASIC 204 are bonded to each other using a layer of glass frit 502 on the bottom side 218 of the ASIC 204 and a layer of silicon dioxide 504 on the top side 208 of the MEMS pressure sensing element 202.

Figure 6:
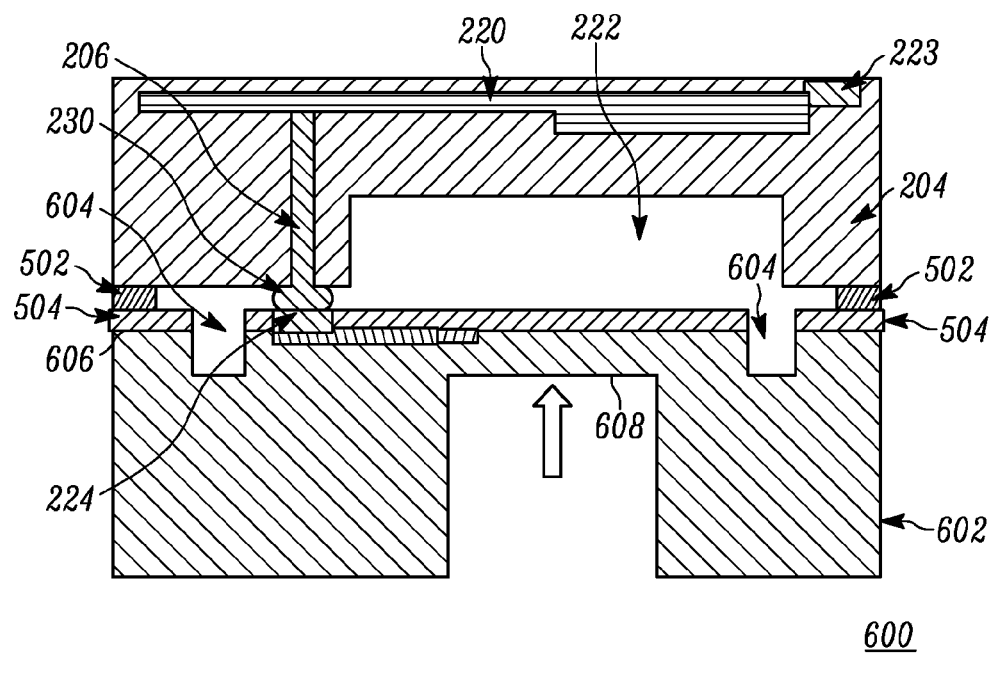
FIG. 6 is a cross-sectional view of a fourth embodiment of a pressure sensor device comprising groove on the topside of a MEMS pressure sensing element of the third embodiment shown in FIG. 5.

FIG. 6 shows another embodiment of a pressure sensor device 600. The ASIC 204 is attached to the top side of a MEMS pressure sensing element 602, which has a groove 604 formed into the top side 606 of the element 602. The groove 604, which is shown in cross section, surrounds the diaphragm formed into the top side 606 of the MEMS pressure sensing element and collects excess glass frit during the heating required to liquefy the glass frit.

Figure 7:
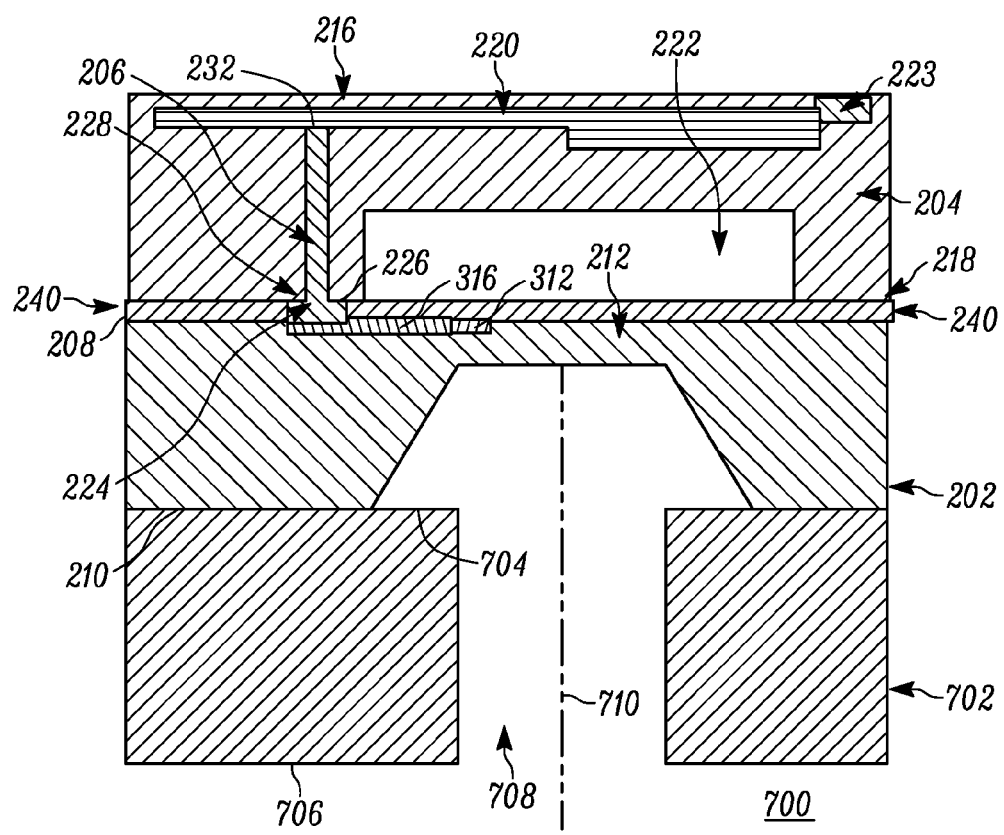
FIG. 7 is a cross-sectional view of the first embodiment of a pressure sensor device with a pedestal mounted onto the backside of a MEMS pressure sensing element.

FIG. 7 is a cross-sectional view of the pressure sensor device 200 shown in FIG. 2A mounted to a pedestal 702. The pedestal 702 has a top surface 704 and an opposing bottom surface 706. It also has an aperture 708 that extends all the way through the pedestal 702. The center 710 of the aperture 708 is aligned with, or at least substantially aligned with the middle of the diaphragm 212 formed in the MEMS pressure sensing element 202. The pedestal 702 is preferably made of glass or silicon. It isolates the sensing element 202 from surfaces of a housing having thermal expansion coefficients markedly different from the thermal expansion coefficient of the material from which the sensing element 202 is made.

FIG. 8A is a plan view of an alternate embodiment of an ASIC 800, the bottom side 802 of which has a recess 804. FIG. 8B is a perspective view of the bottom side 802. One or more trenches 806 are formed into the bottom side 802 of the ASIC 800. The trenches are narrow and steep-sided cuts or depressions formed into the otherwise substantially planar surface of the bottom side 802 of the ASIC 800. The trenches 806 extend laterally or sideways through the ASIC 800 from the recess 804 through one of the vertical sides 810 of the ASIC 800. The trenches are sized and shaped to allow a fluid, the pressure of which is being sensed, to flow into and out of the recess 804 as well as the cavity formed by the recess 804 when the bottom side 802 of the ASIC 800 is attached to the top side of a MEMS pressure sensing element. The trenches 806, or a patterned bonding layer depicted in FIG. 10, enable the pressure sensing element to which an ASIC is bonded to provide differential pressure sensing. The trenches 806 preferably pass between conductive vias formed in the ASIC.

FIGS. 8A and 8B, which is a perspective view of the bottom side 802, also show that conductive vias 806 can be symmetrically distributed around the recess 804, instead of along one side of an ASIC, as shown in FIG. 2A. In FIGS. 8A and 8B, one conductive via 808A-808D is located near each corner of the ASIC 800. Such vias 808A-808D are thus considered herein to be symmetrically distributed in the ASIC 800.

FIG. 9 is a plan view of an alternate embodiment of a MEMS pressure sensing element 900 having a distributed Wheatstone bridge circuit formed by four separated piezoresistors 908 and interconnects 906. Its top surface 902 is provided corner-located metal bond pads 904A-904D, i.e., bond pads located near the corners of the MEMS pressure sensing element 900. The bond pads 904A-904D are located to align with the symmetrically distributed conductive vias 806A-806D of the ASIC 800 shown in FIG. 8 when the ASIC 800 shown in FIGS. 8A and 8B is place on top of the MEMS pressure sensing element 900 shown in FIG. 9.

Interconnects 906 are formed in the top surface 902 using P+ doping of semiconductor material between the symmetrically distributed bond pads 904A-904D and piezoresistors 908 that are connected to form a Wheatstone bridge. A fusion bonding area 912, described above with regard to FIG. 4, surrounds the bond pads 904A-904D and conductive interconnects 906.

Figure 11:
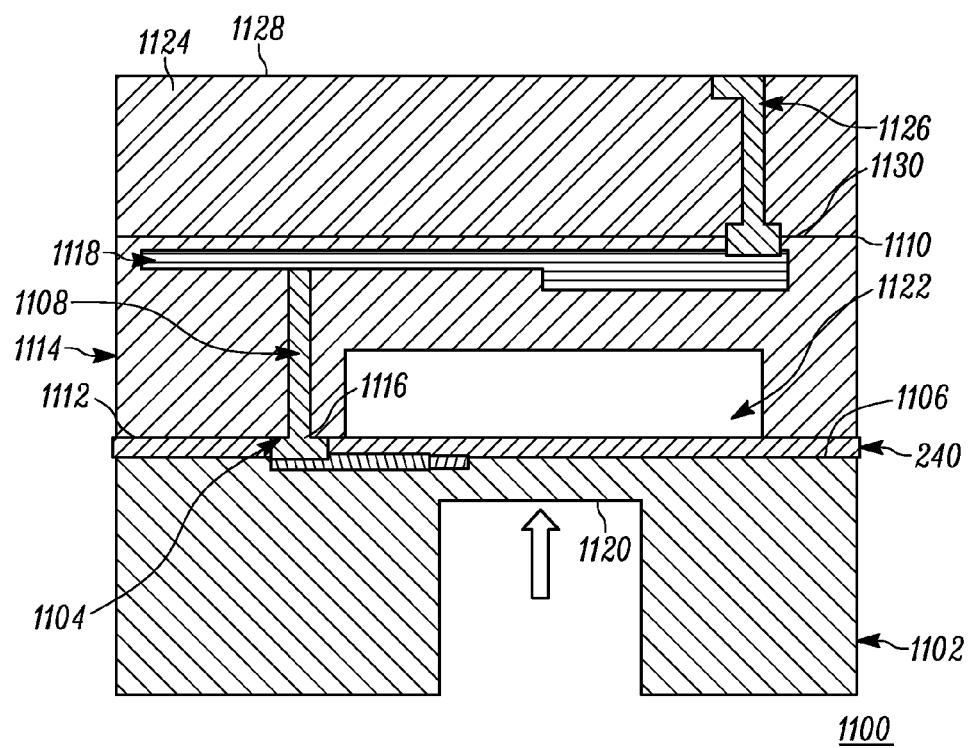
FIG. 11 depicts an alternate embodiment of a pressure sensor device having two integrated circuits stacked on top of a MEMS pressure sensing element.

FIG. 11 depicts an alternate embodiment of a backside pressure sensor device 1100 having two integrated circuits stacked on the top of a backside MEMS pressure sensing element. One of the two integrated circuits is preferably an electromagnetic control chip or EMC chip, which reduces or filters electrical noise but which can have other active and/or passive devices.

The embodiment shown in FIG. 11 comprises a backside MEMS pressure sensing element 1102. As with the MEMS pressure sensing elements described above, the pressure sensing element 1102 shown in FIG. 11 has metal bond pads 1104 on the top surface 1106 of the MEMS pressure sensing element 1102.

The bond pads 1104 are electrically connected to conductive vias 1108 formed at least part way through a first ASIC 1114. The vias 1108 extend between circuitry 1118 formed in the top surface 1110 of the ASIC 1114 and the bottom surface 1112 of the ASIC 1114, An intermetallic bond 1116 is formed between the bond pads 1104 and the vias 1108.

The vias 1108 connect circuitry 1118 in the top surface 1110 of the ASIC 1114 to the bond pads 1104 and hence connect the circuitry 1118 to a Wheatstone bridge circuit located in the diaphragm 1120 of the MEMS pressure sensing element 1102.

The diaphragm 1120 is "covered" by an evacuated cavity 1122. The cavity 1122 is formed from a recess 1122 cut into the bottom surface 1112 of the ASIC 1114 when the ASIC 1114 is attached to the top surface 1106 of the MEMS pressure sensing element 1102.

The second integrated circuit 1124 is connected to the first integrated circuit 1114 by a second set of conductive vias 1126 formed into the second integrated circuit 1124. The second set of vias 1126 extend between the top side or surface 1128 and bottom side or surface 1130 of the second integrated circuit 1124. The second set of vias 1126 go all the way through the second integrated circuit 1124. As can be seen in FIG. 11, the vias 1126 are electrically connected to the circuitry 1118 formed in the top side of the first integrated circuit 1114.

Figure 12:
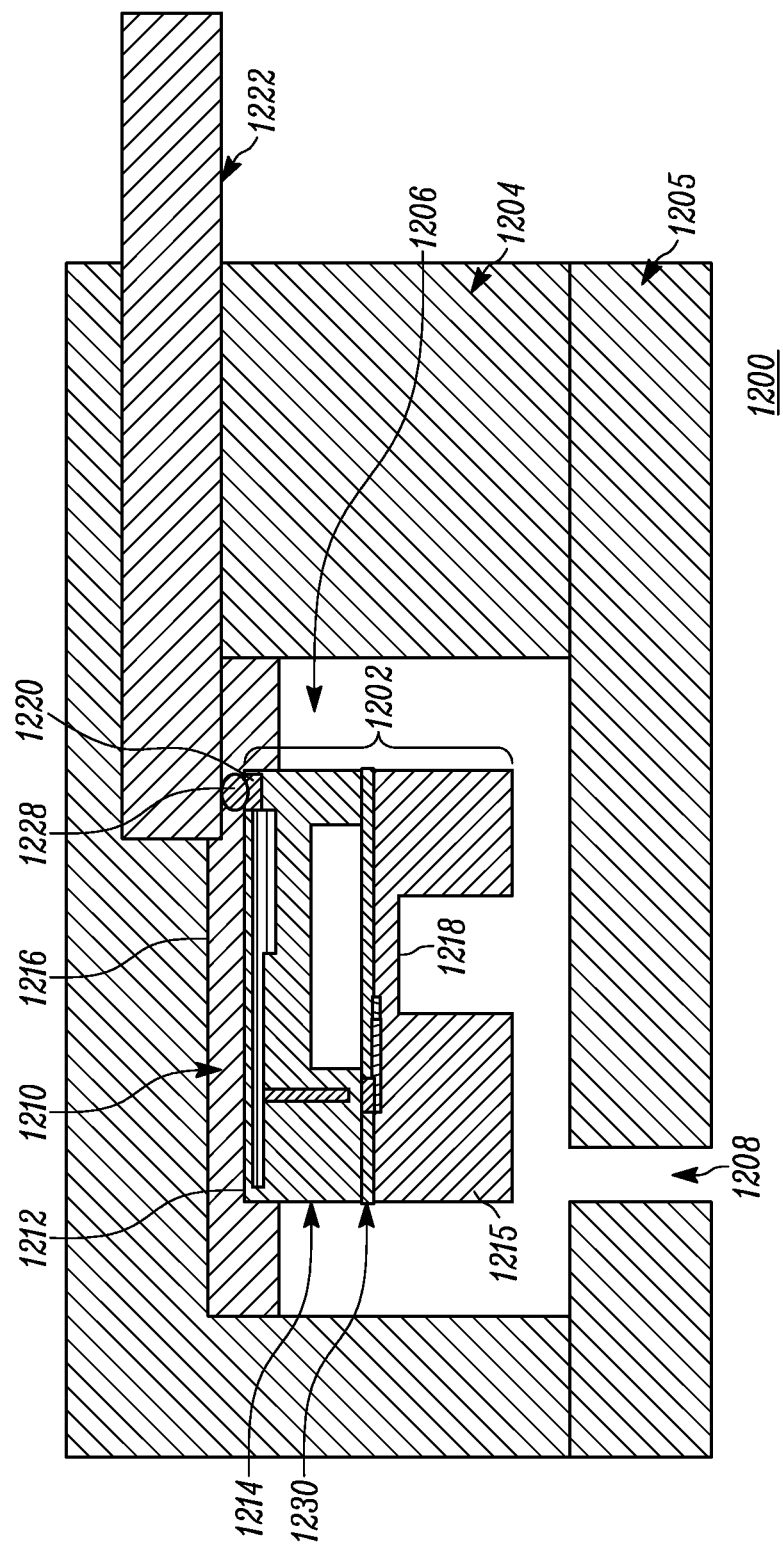
FIG. 12 depicts a first embodiment of a backside absolute pressure sensor module comprising a backside absolute pressure sensor device as shown in at least FIG. 2A, a housing in which the pressure sensor device is located and a lead frame, which extends through the housing and having a fusion bond between the ASIC and the MEMS pressure sensing element.

FIG. 12 depicts a first embodiment of a pressure sensor module 1200. The module 1200 is essentially a pressure sensor device 1202 described above, including at least the one shown in at least FIG. 2, sealed inside an interior space of a housing 1204. The pressure sensor device 1202 comprises an ASIC 1214 and a MEMS pressure sensing element 1215. They are bonded to each other using a fusion bond 1230 described above.

The interior space where the pressure sensor device 1202 is located is referred to herein as a pocket 1206. A pressure port 1208 is formed through the cover 1205 and leads into the pocket 1206. The port 1208 is sized and shaped to allow a fluid to flow through the port 1208 and apply pressure to the diaphragm 1218 of the pressure sensor device 1202.

The pressure sensor device 1202 is mounted to the top side 1216 of the pocket 1206 by an adhesive 1210. An electrical connection between a lead frame 1222 and bond pads 1220 on the top side 1212 of the ASIC 1214 is provided by an electrically conductive adhesive (ECA) or a solder bump 1228. The adhesive 1210 is non-conductive and protects the bond pad 1220 as well as the ECA or solder bump 1228.

Figure 13:
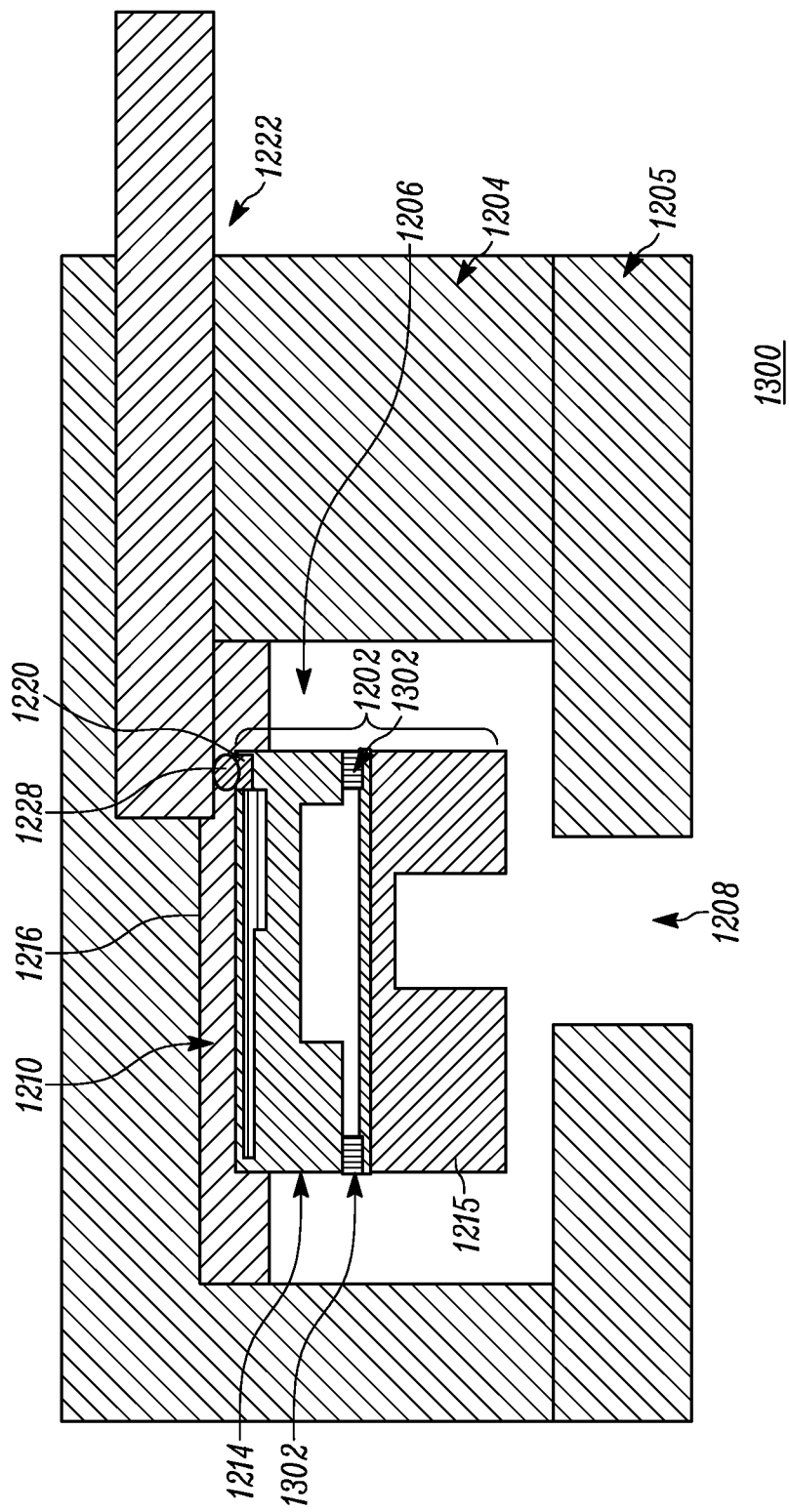
FIG. 13 depicts a second embodiment of a backside absolute pressure sensor module, which has a glass frit bond between the ASIC and the MEMS pressure sensing element.

FIG. 13 depicts a second embodiment of a pressure sensor module 1300. The pressure sensor module 1300 of FIG. 13 differs from the pressure sensing module 1200 of FIG. 12 by only the use of a glass frit bond 1302 between the ASIC 1214 and MEMS pressure sensing module 1215. The glass frit bond is provided by a layer of glass frit between the ASIC 1214 and MEMS pressure sensing module 1215.

Figure 14:
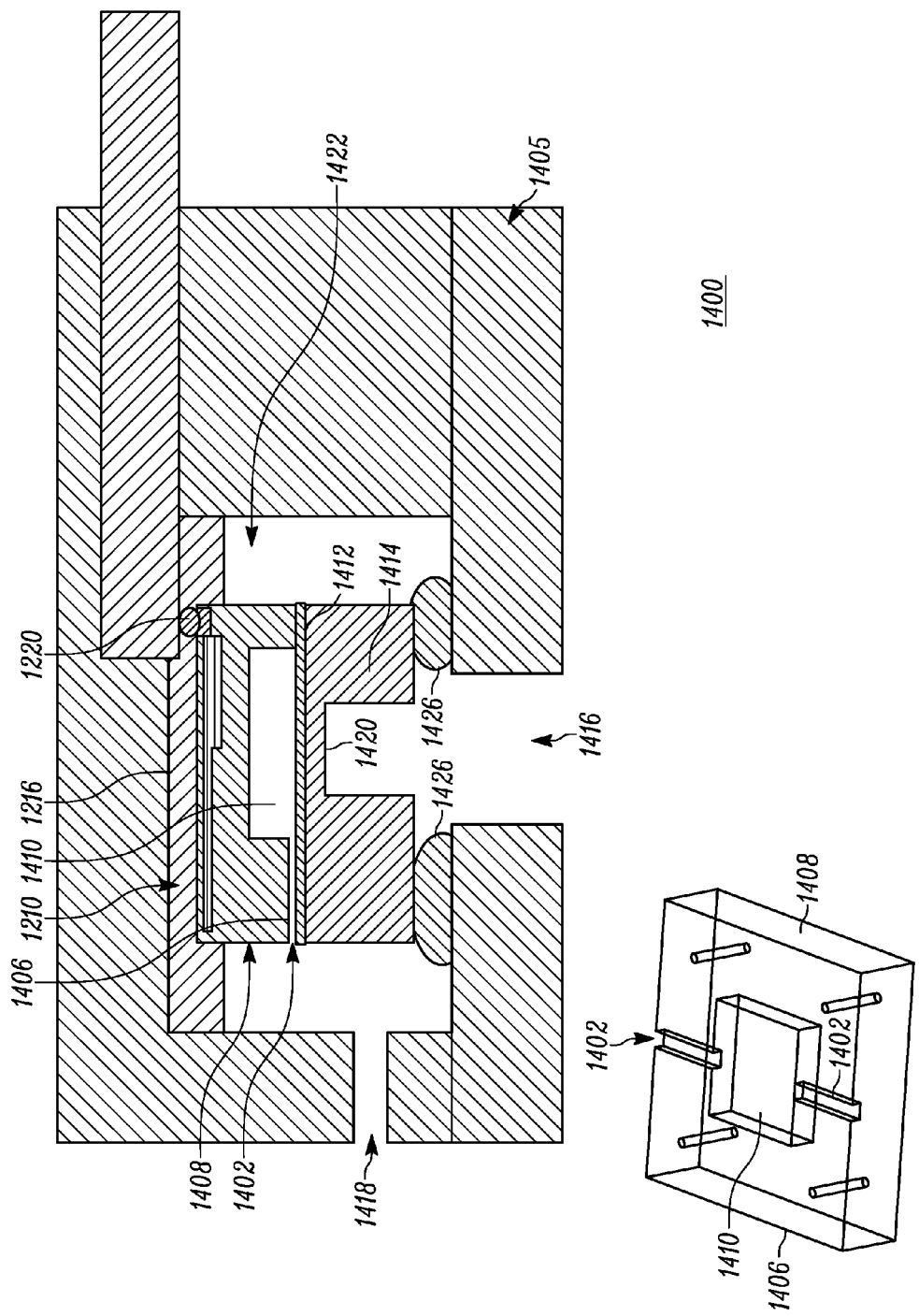
FIG. 14 depicts a cross section of a differential pressure sensor module having a fusion bond between the ASIC and the MEMS pressure sensing element.

FIG. 14 depicts a differential pressure sensor module 1400. It differs from the pressure sensor modules shown in FIGS. 12 and 13 by the addition of a trench 1402 formed in the bottom side 1406 of an ASIC 1408, which allows fluid to enter the cavity 1410 formed by a recess in the bottom side 1406 of the ASIC 1408 and attachment of the ASIC 1408 to the top side 1412 of a MEMS pressure sensing element 1414.

Unlike the pressure sensor modules described above, the pressure sensor module 1400 shown in FIG. 14 is provided with two pressure ports 1416 and 1418. A first pressure port 1416 provides a path by which fluid can apply pressure to the backside 1420 of the MEMS pressure sensing element 1414. An adhesive 1426 attaches the MEMS pressure sensing element 1414 to the cover 1405 and provides a seal around the first pressure port 1416.

The second pressure port 1418 provides a second and separate path by which a different fluid can apply pressure to the pocket 1422 and the cavity 1410 and hence the top side 1412 of the MEMS pressure sensing element 1414 via the trench 1402. The pressure sensor module 1400 of FIG. 14 is used for differential pressure sensing while the pressure sensor modules shown in FIGS. 12 and 13 are used for backside absolute pressure sensing.

Figure 15:
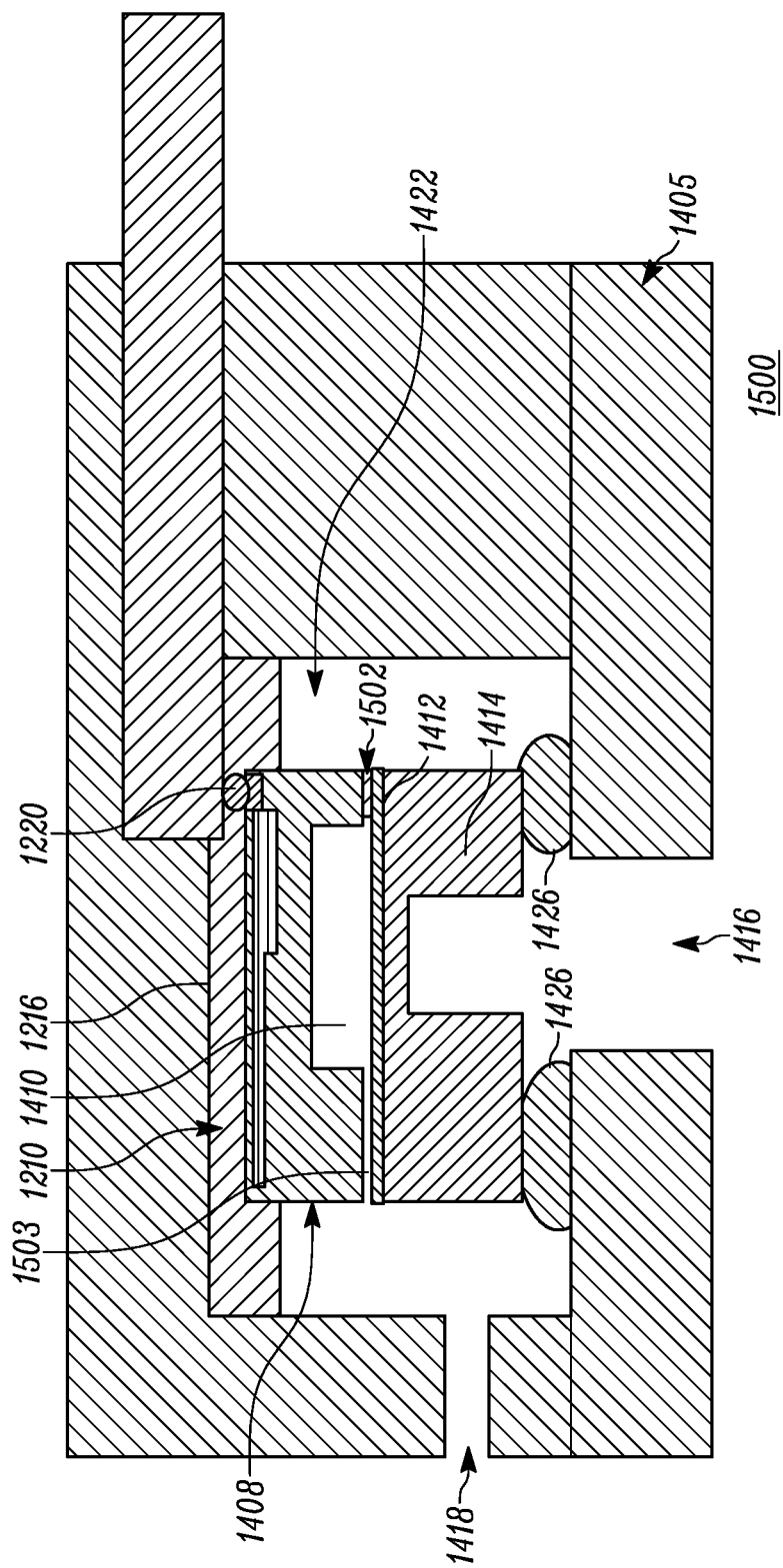
FIG. 15 depicts a cross section of a second embodiment of a pressure sensor module having a patterned glass frit bond between the ASIC and MEMS pressure sensing element.

FIG. 15 depicts another embodiment of a differential pressure sensor module 1500. It differs from the pressure sensor module 1400 of FIG. 14 by the use of a patterned glass frit 1502 between the ASIC 1408 and MEMS pressure sensing element 1414. As shown in FIG. 10 and described above, the patterned glass frit 1502 provides a path 1503 for pressurized fluid to flow from the pocket 1422 into the cavity 1410 and exert pressure on the topside of the diaphragm.

Figure 16:
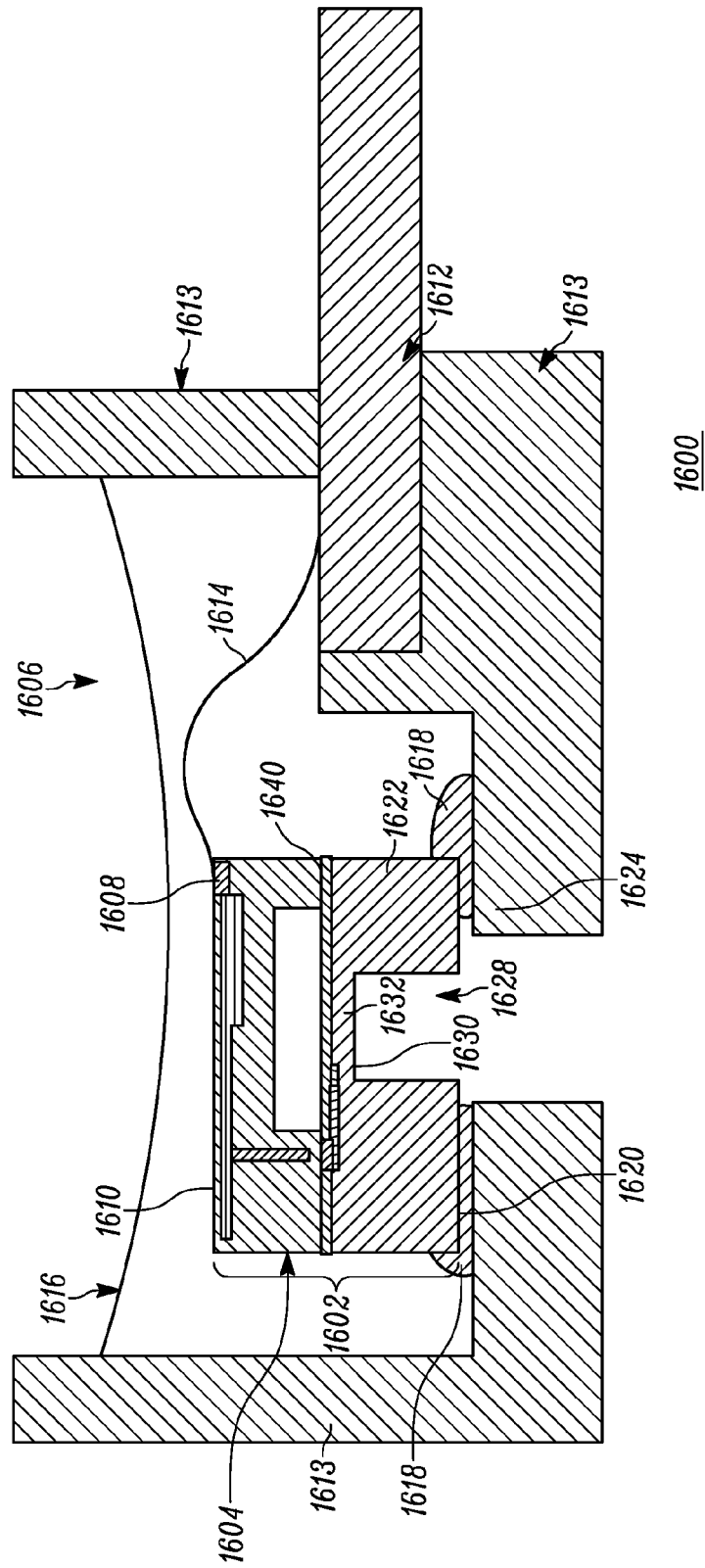
FIG. 16 depicts a cross section of a pressure sensor module comprising a backside absolute pressure sensor device formed by fusion bond, such as the one shown in at least FIGS. 2A and 2B, the ASIC metallic bond pads of which are connected to lead frames using bond wires that are protected by a viscous gel.

FIG. 16 depicts a backside absolute pressure sensor module 1600 comprising a backside absolute pressure sensor device 1602 inside a housing 1613 having a pocket 1606 that encloses the pressure sensor device 1602. As with the pressure sensor devices described above, the pressure sensor device 1602 depicted in FIG. 16 comprises an ASIC 1604 attached to the top side of a MEMS pressure sensing element 1622, as described above with respect to at least FIG. 2A. The ASIC 1604 is attached to the MEMS pressure sensing element 1622 by a fusion bond 1640, described above.

The ASIC 1604 has metallic bond pads 1608 on the top side 1610 of the ASIC 1604 that are connected by bond wires 1614 to lead frames 1612 that extend through the housing 1613. The bond wires 1614 are thin and fragile. The bond wires 1614 are therefore protected from breakage by a layer of a viscous gel 1616 that essentially fills the pocket 1606.

A layer of adhesive 1618 between the bottom 1620 of the backside MEMS pressure sensing element 1622 and the bottom 1624 of the pocket 1606 attaches the MEMS pressure sensing element 1622 to the bottom 1624 of the pocket 1606. The adhesive 1618 also provides a seal around an aperture 1628 through which a fluid can exert a pressure against the backside 1630 of a diaphragm 1632 formed in the pressure sensing element 1622. In yet another embodiment, a conformal coating layer is used to hold and protect the bond wire 1614.

Figure 17:
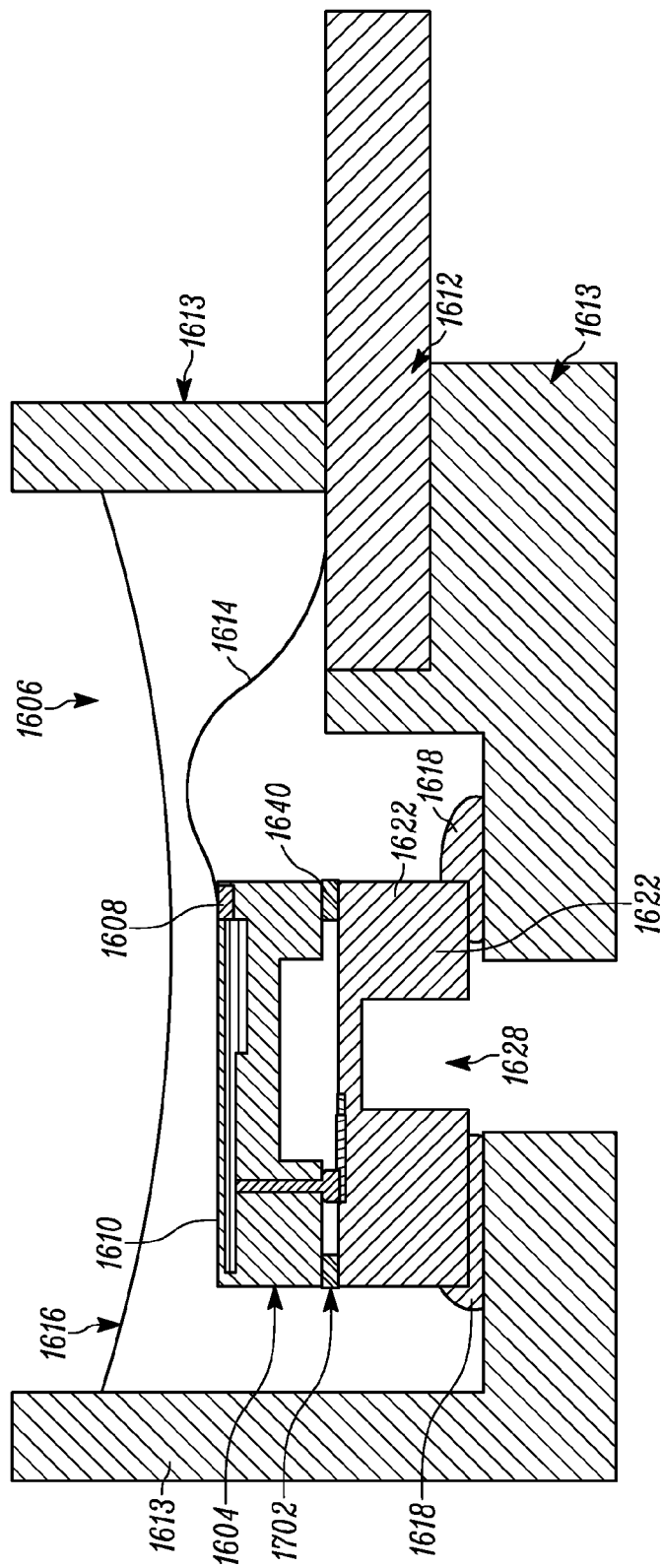
FIG. 17 is a cross section of an alternate embodiment of a backside absolute pressure sensor module as shown in FIG. 16, formed by a patterned glass frit bond.

FIG. 17 depicts a second and alternate embodiment of the pressure sensor module 1600 shown in FIG. 16. The pressure sensor module 1700 shown in FIG. 17 differs from the sensor module 1600 shown in FIG. 16 by only the use of a glass frit 1702 that provides a glass frit bond between the ASIC 1604 and the MEMS pressure sensing element 1622. The bond wires 1614 are protected by a viscous gel 1616.

Those of ordinary skill in the art will recognize that the foregoing description is for purposes of illustration only. The true scope of the invention is set forth in the following claims.

What is claimed is:

1. A pressure sensor device comprising:
   a MEMS pressure sensing element having first and second sides with a flexible diaphragm and a Wheatstone bridge circuit on the first side;
   a first integrated circuit comprising a substrate with first and second sides, electronic circuitry formed into a predetermined portion of the first side and a recess formed into the second side, the second side of the first integrated circuit being attached to the first side of the MEMS pressure sensing element, the recess of the first integrated circuit and the first side of the MEMS pressure sensing element defining a substantially evacuated cavity;
   a first plurality of conductive vias formed into the first integrated circuit substrate such that the first plurality of vias extend through the substrate and electrically connect the Wheatstone bridge circuit of the MEMS pressure sensing element to the circuitry formed into the first side of the first integrated circuit; and
   at least one of:
      i) a layer of silicon dioxide between the first side of the MEMS pressure sensing element and the second side of the first integrated circuit, the layer of silicon dioxide forming a silicon fusion bond between the MEMS pressure sensing element and the integrated circuit; and an intermetallic bond formed between at least one of the conductive vias and an electrical contact on the first side of the MEMS pressure sensing element;
      and
      ii) a layer of glass frit located between the first side of the MEMS pressure sensing element and the second side of the first integrated circuit, the layer of glass frit forming a bond between the MEMS pressure sensing element and the first integrated circuit; and an electrically conductive protuberance between at least one of the conductive vias and an electrical contact on the first side of the MEMS pressure sensing element.

2. The pressure sensor device of claim 1, wherein the plurality of conductive vias are symmetrically distributed in the first integrated circuit substrate.

3. The pressure sensor device of claim 1, further comprising a second integrated circuit attached to the first side of the first integrated circuit, the second integrated circuit comprising a substrate with first and second sides and electronic circuitry formed into a predetermined portion of its first side.

4. The pressure sensor device of claim 3, further comprising a second plurality of conductive vias formed into the second integrated circuit substrate such that the second plurality of vias extend through the substrate of the second integrated circuit and electrically connect circuitry of the first integrated circuit to circuitry of the second integrated circuit.

5. The pressure sensor of device of claim 1, further comprising a pedestal attached to the second side of the MEMS pressure sensing element, the pedestal comprising an aperture, which is substantially aligned to the flexible diaphragm.

6. A pressure sensor device comprising:
   a MEMS pressure sensing element having first and second sides with a flexible diaphragm and a Wheatstone bridge circuit on the first side;
   a first integrated circuit comprising a substrate with first and second sides, electronic circuitry formed into a predetermined portion of the first side and a recess formed into the second side, the second side of the first integrated circuit being attached to the first side of the MEMS pressure sensing element, the recess of the first integrated circuit and the first side of the MEMS pressure sensing element defining a cavity;
   a first plurality of conductive vias formed into the first integrated circuit substrate such that the first plurality of vias extend through the substrate and electrically connect the Wheatstone bridge circuit of the MEMS pressure sensing element to the circuitry formed into the first side of the first integrated circuit; and
   at least one of:
      i) a layer of silicon dioxide between the first side of the MEMS pressure sensing element and the second side of the first integrated circuit, the layer of silicon dioxide forming a silicon fusion bond between the MEMS pressure sensing element and the integrated circuit, the second side further comprising at least one trench formed to extend into the recess; and an intermetallic bond formed between at least one of the conductive vias and an electrical contact on the first side of the MEMS pressure sensing element;
      and
      ii) a layer of glass frit located between the first side of the MEMS pressure sensing element and the second side of the first integrated circuit, the layer of glass frit forming a bond between the MEMS pressure sensing element and the first integrated circuit; and an electrically conductive protuberance between at least one of the conductive vias and an electrical contact on the first side of the MEMS pressure sensing element, wherein the layer of glass frit is patterned to provide at least one media path through the layer of glass fit, the media path being configured to allow a predetermined fluid to pass through the media path and to the recess formed into the second side of the first integrated circuit.

7. The pressure sensor device of claim 6, wherein the plurality of conductive vias are symmetrically distributed in the first integrated circuit substrate.

8. The pressure sensor device of claim 6, further comprising a second integrated circuit attached to the first side of the first integrated circuit, the second integrated circuit comprising a substrate with first and second sides and electronic circuitry formed into a predetermined portion of its first side.

9. The pressure sensor device of claim 8, further comprising a second plurality of conductive vias formed into the second integrated circuit substrate such that the second plurality of vias extend through the substrate of the second integrated circuit and electrically connect circuitry of the first integrated circuit to circuitry of the second integrated circuit.

10. A pressure sensor module comprising:
a pressure sensor device comprising:
 a MEMS pressure sensing element having first and second sides with a flexible diaphragm and a Wheatstone bridge circuit on the first side;
 a first integrated circuit comprising a substrate with first and second sides, electronic circuitry formed into a predetermined portion of the first side and a recess formed into the second side, the second side of the first integrated circuit being attached to the first side of the MEMS pressure sensing element, the recess of the first integrated circuit and the first side of the MEMS pressure sensing element defining a substantially evacuated cavity; and
 a first plurality of conductive vias formed into the first integrated circuit substrate such that the first plurality of vias extend through the substrate and electrically connect the Wheatstone bridge circuit of the MEMS pressure sensing element to the circuitry formed into the first side of the first integrated circuit;
a housing having a pocket that encloses the pressure sensor device and a pressure port configured to allow a predetermined fluid to apply pressure to the diaphragm; and
a lead frame that extends from an electrical contact on the first side of the first integrated circuit through the housing, the electrical contact on the first side of the first integrated circuit comprising at least one of an electrically conductive protuberance and an electrically conductive adhesive.

11. The pressure sensor module of claim 10, further comprising a layer of adhesive between the first integrated circuit and an interior surface of the pocket, the layer of adhesive being configured to mount the pressure sensor device to an interior surface of the pocket and substantially cover the electrical contact on the first side of the first integrated circuit.

12. The pressure sensor module of claim 10, wherein the MEMS pressure sensing element has a plurality of electrical contacts on its first side, the pressure sensor device further comprising:
a layer of silicon dioxide between the first side of the MEMS pressure sensing element and second side of the first integrated circuit, the layer of silicon dioxide forming a silicon fusion bond between the MEMS pressure sensing element and the first integrated circuit; and
an intermetallic bond formed between at least one of the conductive vias and an electrical contact on the first side of the MEMS pressure sensing element.

13. The pressure sensor module of claim 10, wherein the MEMS pressure sensing element has a plurality of electrical contacts on its first side, the pressure sensor device further comprising:
a layer of glass frit located between the first side of the MEMS pressure sensing element and the second side of the first integrated circuit, the layer of glass frit forming a bond between the MEMS pressure sensing element and the first integrated circuit; and
an electrically conductive protuberance between at least one of the conductive vias and an electrical contact on the first side of the MEMS pressure sensing element.

14. The pressure sensor module of claim 10, wherein the plurality of conductive vias are symmetrically distributed in the first integrated circuit substrate.

15. The pressure sensor module of claim 10, further comprising a second integrated circuit attached to the first side of the first integrated circuit, the second integrated circuit comprising a substrate with first and second sides and electronic circuitry formed into a predetermined portion of its first side.

16. The pressure sensor module of claim 15, further comprising a second plurality of conductive vias formed into the second integrated circuit substrate such that the second plurality of vias extend through the substrate of the second integrated circuit and electrically connect circuitry of the first integrated circuit to circuitry of the second integrated circuit.

17. The pressure sensor module of claim 10, further comprising a pedestal attached to the second side of the MEMS pressure sensing element, the pedestal comprising an aperture, which is substantially aligned to the flexible diaphragm.

18. A pressure sensor module comprising:
a pressure sensor device comprising:
 a MEMS pressure sensing element having first and second sides with a flexible diaphragm and a Wheatstone bridge circuit on the first side;
 a first integrated circuit comprising a substrate with first and second sides, electronic circuitry formed into a predetermined portion of the first side and a recess formed into the second side, the second side of the first integrated circuit being attached to the first side of the MEMS pressure sensing element, the recess of the first integrated circuit and the first side of the MEMS pressure sensing element defining a substantially evacuated cavity; and
 a first plurality of conductive vias formed into the first integrated circuit substrate such that the first plurality of vias extend through the substrate and electrically connect the Wheatstone bridge circuit of the MEMS pressure sensing element to the circuitry formed into the first side of the first integrated circuit; and
 at least one of:
 i) a layer of silicon dioxide between the first side of the MEMS pressure sensing element and the second side of the first integrated circuit, the layer of silicon dioxide forming a silicon fusion bond between the MEMS pressure sensing element and the integrated circuit; and an intermetallic bond formed between at least one of the conductive vias and an electrical contact on the first side of the MEMS pressure sensing element; and ii) a layer of glass frit located between the first side of the MEMS pressure sensing element and the second side of the first integrated circuit, the layer of glass frit forming a bond between the MEMS pressure sensing element and the first integrated circuit; and an electrically conductive protuberance between at least one of the conductive vias and an electrical contact on the first side of the MEMS pressure sensing element;

a housing having a pocket that encloses the pressure sensing device and a pressure port configured to allow a predetermined fluid to apply pressure to the diaphragm;

a lead frame that extends from inside the pocket through the housing;

a bond wire that extends from an electrical contact on the first side of the first integrated circuit to the lead frame; and an adhesive layer located between the second side of the MEMS pressure sensing element and an interior surface of the pocket through which the pressure port is formed, the adhesive layer surrounding and sealing the pressure port to the second side of the MEMS pressure sensing element.

19. The pressure sensor module of claim 18, further comprising a layer of gel inside the pocket and substantially covering the pressure sensor device.

20. The pressure sensor module of claim 18, further comprising a conformal coating over the pressure sensor device, the bond wire and at least part of the lead frame.

21. The pressure sensor module of claim 18, wherein the plurality of conductive vias are symmetrically distributed in the first integrated circuit substrate.

22. The pressure sensor module of claim 18, further comprising a second integrated circuit attached to the first side of the first integrated circuit, the second integrated circuit comprising a substrate with first and second sides and electronic circuitry formed into a predetermined portion of its first side.

23. The pressure sensor module of claim 22, further comprising a second plurality of conductive vias formed into the second integrated circuit substrate such that the second plurality of vias extend through the substrate of the second integrated circuit and electrically connect circuitry of the first integrated circuit to circuitry of the second integrated circuit.

24. The pressure sensor module of claim 18, further comprising a pedestal attached to the second side of the MEMS pressure sensing element, the pedestal comprising an aperture, which is substantially aligned to the flexible diaphragm.

25. A pressure sensor module comprising:
a pressure sensor device comprising:
a MEMS pressure sensing element having first and second sides with a flexible diaphragm and a Wheatstone bridge circuit on the first side;
a first integrated circuit comprising a substrate with first and second sides, electronic circuitry formed into a predetermined portion of the first side and a recess formed into the second side, the second side of the first integrated circuit being attached to the first side of the MEMS pressure sensing element, the recess of the first integrated circuit and the first side of the MEMS pressure sensing element defining a cavity;
a first plurality of conductive vias formed into the first integrated circuit substrate such that the first plurality of vias extend through the substrate and electrically connect the Wheatstone bridge circuit of the MEMS pressure sensing element to the circuitry formed into the first side of the first integrated circuit; and
at least one of:

i) a layer of silicon dioxide between the first side of the MEMS pressure sensing element and the second side of the first integrated circuit, the layer of silicon dioxide forming a silicon fusion bond between the MEMS pressure sensing element and the integrated circuit, the second side further comprising at least one trench formed to extend into the recess; and an intermetallic bond formed between at least one of the conductive vias and an electrical contact on the first side of the MEMS pressure sensing element; and ii) a layer of glass frit located between the first side of the MEMS pressure sensing element and the second side of the first integrated circuit, the layer of glass frit forming a bond between the MEMS pressure sensing element and the first integrated circuit; and an electrically conductive protuberance between at least one of the conductive vias and an electrical contact on the first side of the MEMS pressure sensing element wherein the layer of glass frit is patterned to provide at least one media path through the layer of glass frit, the media path being configured to allow a predetermined fluid to pass through the media path and to the recess formed into the second side of the first integrated circuit;

a housing having a pocket that encloses the pressure sensing device and a pressure port configured to allow a predetermined fluid to apply pressure to the diaphragm;

a lead frame that extends from inside the pocket through the housing;

a bond wire that extends from an electrical contact on the first side of the first integrated circuit to the lead frame; and an adhesive layer located between the second side of the MEMS pressure sensing element and an interior surface of the pocket through which the pressure port is formed, the adhesive layer surrounding and sealing the pressure port to the second side of the MEMS pressure sensing element.

26. The pressure sensor module of claim 25, wherein the plurality of conductive vias are symmetrically distributed in the first integrated circuit substrate.

27. The pressure sensor module of claim 25, further comprising a second integrated circuit attached to the first side of the first integrated circuit, the second integrated circuit comprising a substrate with first and second sides and electronic circuitry formed into a predetermined portion of its first side.

28. The pressure sensor module of claim 27, further comprising a second plurality of conductive vias formed into the second integrated circuit substrate such that the second plurality of vias extend through the substrate of the second integrated circuit and electrically connect circuitry of the first integrated circuit to circuitry of the second integrated circuit.

* * * * *